United States Patent
Hyodo et al.

(10) Patent No.: US 8,105,661 B2
(45) Date of Patent: Jan. 31, 2012

(54) METHOD FOR FORMING POROUS INSULATION FILM

(75) Inventors: Yasuyoshi Hyodo, Tama (JP); Kazuo Kohmura, Sodegaura (JP); Nobutoshi Fujii, Chigasaki (JP); Nobutaka Kunimi, Osaka (JP); Keizo Kinoshita, Tokyo (JP)

(73) Assignees: ASM Japan K.K., Tama-shi, Tokyo (JP); Ulvac, Inc., Chihasaki-shi, Kanagawa (JP); NEC Corporation, Tokyo (JP)

( * ) Notice: Subject to any disclaimer, the term of this patent is extended or adjusted under 35 U.S.C. 154(b) by 1188 days.

(21) Appl. No.: 11/559,797

(22) Filed: Nov. 14, 2006

(65) Prior Publication Data

US 2007/0161257 A1    Jul. 12, 2007

(30) Foreign Application Priority Data

Nov. 15, 2005  (JP) ................................. 2005-330368

(51) Int. Cl.
*H05H 1/24* (2006.01)
(52) U.S. Cl. ... 427/578; 427/489; 427/579; 427/255.37; 427/255.23
(58) Field of Classification Search .................. 427/508, 427/489, 578, 579, 255.37, 255.23, 534, 427/536, 539, 385.5, 387, 553–559, 196, 427/198
See application file for complete search history.

(56) References Cited

U.S. PATENT DOCUMENTS

| | | | |
|---|---|---|---|
| 6,432,846 B1 | 8/2002 | Matsuki | |
| 6,602,800 B2 | 8/2003 | Matsuki | |
| 2003/0033980 A1 | 2/2003 | Campbell et al. | |
| 2004/0115954 A1* | 6/2004 | Todd | 438/781 |
| 2006/0021701 A1 | 2/2006 | Tobe et al. | |
| 2006/0078676 A1* | 4/2006 | Lukas et al. | 427/248.1 |
| 2007/0173071 A1 | 7/2007 | Afzali-Ardakani et al. | |
| 2007/0189961 A1 | 8/2007 | Iacopi et al. | |

OTHER PUBLICATIONS

U.S. Appl. No. 11/175,511, filed Jul. 6, 2005, ASM Japan K.K.
Nobuhiro Hata, et al., "Control of Pore Structures in Periodic Porous Silica Low-κ Films," Japanese Journal of Applied Physics, vol. 43, No. 4A, 2004, pp. 1323-1326.
Nobutoshi Fuji, et al., "Comparative Studies of Ultra Low-κ Porous Silica Films with 2-D Hexagonal and Disordered Pore Structures," Mat. Res. Soc. Symp. Proc. vol. 812 F4.10.1-F4.10.6, 2004.

* cited by examiner

*Primary Examiner* — Marianne L Padgett
*Assistant Examiner* — Robert S Walters, Jr.
(74) *Attorney, Agent, or Firm* — Knobbe, Martens, Olson & Bear, LLP

(57) ABSTRACT

A method of forming a porous film on a processing target includes: forming fine organic particles by polymerizing an organic compound in a gaseous phase; mixing the fine organic particles with a silicon compound containing a Si—O bond in a gaseous phase, thereby depositing a film containing the fine particles on the processing target; and removing the fine organic particles from the film.

13 Claims, 3 Drawing Sheets

METHOD FOR FORMING POROUS INSULATION FILM

BACKGROUND OF THE INVENTION

1. Field of the Invention

The present invention relates to thin film formation technology for integrated semiconductor circuit, and particularly to a method of forming a porous film having low dielectric constant for use as inter-layer insulation film for multi-layer wiring.

2. Description of the Related Art

Wiring widths and intervals have been constantly decreasing in recent years to respond to the needs for more highly integrated, faster semiconductor devices. As this trend accelerates, however, one problem has surfaced that pertains to signal delay caused by wiring resistance (R) and inter-wire capacity (C) in a multi-layer wiring structure constituting a semiconductor device (this delay is called "RC delay"). To reduce RC delay, the industry first adopted copper having lower resistance R in place of traditional aluminum. In 90-nm node applications, the industry also replaced silicon oxide film ($SiO_2$ film) having a dielectric constant k of 4 used traditionally as inter-layer insulation film, with another class of film exhibiting low dielectric constant (low-k film), called SiOC film, produced by introducing methyl groups into silicon oxide film. Examples of SiOC film include siloxane polymer film (SiOC film) whose specific dielectric constant is less than 3.0, formed by the plasma CVD method using $(CH_3)_2Si(OCH_3)_2$ and other material gases as disclosed in U.S. Pat. No. 6,432,846.

Next-generation 65-nm and 45-nm nodes are demanding inter-layer insulation film exhibiting even lower levels of specific dielectric constant, and ITRS (International Technology Roadmap for Semiconductors) 2003 reported specific dielectric constant 2.4 for 65-nm nodes and 2.1 or less for 45-nm nodes as ideal levels of specific dielectric constant. To achieve these levels of specific dielectric constant, an attempt has been made to introduce air, which has a specific dielectric constant of 1, into film (i.e., to make pores in film). For example, porous silica film developed under the Semiconductor MIRAI Project has a specific dielectric constant of 2.0. Through X-ray measurement, this film has been shown to have many pores with a diameter of approx. 2 nm (e.g., Hata et al., J. J. Appl. Phys 43(2004), 1323, Fujii et al., Mat. Res. Soc. Symp. Proc. Vol. 812, F4.10.1).

This porous silica film is formed by means of coating a semiconductor substrate with polysiloxane solution containing pore-forming casting molecules, and then heat-treating the coated substrate. In the solution, multiple pore-forming casting molecules come together to form micelles. When heat is applied, polysiloxane constitutes a network and at the same time micelles break down and are removed from the film due to the effect of heat. As a result, polysiloxane film containing pores with a diameter of several nm is formed. The coating method allows for easy material design, and the specific dielectric constant of film as well as pore diameter can be adjusted by changing the size and quantity of pore-forming casting molecules contained in the solution.

SUMMARY OF THE INVENTION

In a gaseous-phase method like plasma CVD, material gas is supplied in gaseous form and therefore molecules with a molecular weight exceeding 500 cannot be used as material. To create pores with a diameter of several nm, the molecular weight of micelles becomes nearly 10,000 (Hata et al., J. J. Appl. Phys 43(2004), 1323). Such heavy molecules cannot be supplied in gaseous form. This means that conventionally, porous silica film having pores of several nm can only be formed using a coating method.

In a semiconductor device, inter-layer insulation film contacts different types of film such as barrier film and etch stopper film. For this reason, low-k inter-layer insulation film must have good adhesion property with respect to these other films, in addition to exhibiting low dielectric constant. Semiconductor devices are manufactured in a number of processes, and the process of forming inter-layer insulation film is one of them. Therefore, changing the process conditions in the preceding and/or subsequent processes will change the film quality required of inter-layer insulation film. With any coating method, the composition of film material solution must be changed. However, it is difficult to make the necessary changes quickly.

On the other hand, optimization of film quality is easy if inter-layer insulation film is formed using a gaseous-phase method, one representative example of which is plasma CVD. Since all it takes is to change the setting conditions (flow rate, pressure, etc.) of the film forming apparatus, optimization can be done quickly. Also, changing the film forming conditions in the initial or final stage of the film formation process is also easy, and such in-process changes can be made to improve the adhesion property of film. For these reasons, it is desirable that low-k inter-layer insulation film be formed using a gaseous-phase method.

In view of the above, in an embodiment, an object of the present invention is mainly to provide a method of forming with a gaseous-phase method low-k porous film comprising Si—O bond.

To solve at least one of the aforementioned problems, in an embodiment, the present invention provides a method of forming a porous film on a processing target comprising the steps of: (i) forming fine organic particles by polymerizing an organic compound in gaseous phase; (ii) mixing the fine organic particles with a silicon compound containing a Si—O bond in a gaseous phase, thereby depositing a film containing the fine particles on the processing target; and (iii) removing the fine organic particles from the film. In the above, "an organic compound" and "a silicon compound" are collective terms and can be comprised of one or more organic compounds and one or more silicon compounds, respectively.

In an embodiment, formation of fine organic particles may use polymerization reaction of an organic compound implemented by means of plasma, or polymerization reaction of an organic compound implemented by means of ultraviolet light.

In an embodiment, a film may be formed through reaction of silicon compound using plasma.

In an embodiment, preferably, the process of forming fine organic particles and the process of depositing a film may be carried out in separate processing chambers.

According to an embodiment of the present invention, a porous film comprising at least one Si—O bond and exhibiting a low specific dielectric constant (e.g., less than 2.7) as well as excellent adhesion property can be formed using a gaseous-phase method.

Also, in an embodiment, the present invention allows fine changes to be made to film quality quickly.

Furthermore, in an embodiment, the present invention makes it possible to produce a porous low-k film easily without increasing equipment cost.

For purposes of summarizing the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not to scale.

DETAILED DESCRIPTION OF THE PREFERRED EMBODIMENT

The present invention will be explained with reference to preferred embodiments. However, the preferred embodiments are not intended to limit the present invention.

As explained above, in an embodiment, the method comprises forming fine organic particles by polymerizing an organic compound in a gaseous phase; mixing the fine organic particles with a silicon compound containing a Si—O bond in a gaseous phase, thereby depositing a film containing the fine particles on the processing target; and removing the fine organic particles from the film.

In a preferred embodiment, the step of forming the fine organic particles and the step of depositing the film may be performed in separate processing chambers. The separate processing chambers may be upper and lower chambers connected via an intermediate shower plate which is electrically grounded. In an embodiment, the organic compound may be supplied to the upper chamber at a flow rate which is more than 10 times that of the silicon compound supplied to the lower chamber (this may also apply to an embodiment where a single chamber is used).

In an embodiment, first RF power may be applied in the upper chamber for forming the fine organic particles, and second RF power may be applied in the lower chamber for depositing the film, wherein the first RF power and the second RF power have different frequencies.

In an embodiment, the step of forming the fine organic particles may further comprise supplying a first inactive gas to the upper chamber, and the step of depositing the film may further comprise supplying a second inactive gas to the lower chamber, said first and second inactive gases being supplied separately. The first inactive gas may be supplied to the upper chamber at a flow rate higher than that of the organic compound, and the second inactive gas may be supplied to the lower chamber at a flow rate higher than that of the silicon compound.

In an embodiment, the film obtained from the step of removing the fine organic particles may have a dielectric constant of 2.65 or less. The dielectric constant of the film may be adjusted as a function of a flow of the organic compound in the step of forming the fine organic particles. The thickness of the porous film may be 1,000 nm or less (e.g., 10-300 nm).

In all of the embodiments disclosed in this disclosure, any element used in an embodiment can interchangeably or additionally be used in another embodiment unless such a replacement is not feasible or causes adverse effect.

In the present disclosure where conditions and/or structures are not specified, the skilled artisan in the art can readily provide such conditions and/or structures, in view of the present disclosure, as a matter of routine experimentation. For example, the conditions disclosed in U.S. Pat. No. 6,602,800 can be used, the disclosure of which is incorporated herein by reference in its entirety.

Figure 1:
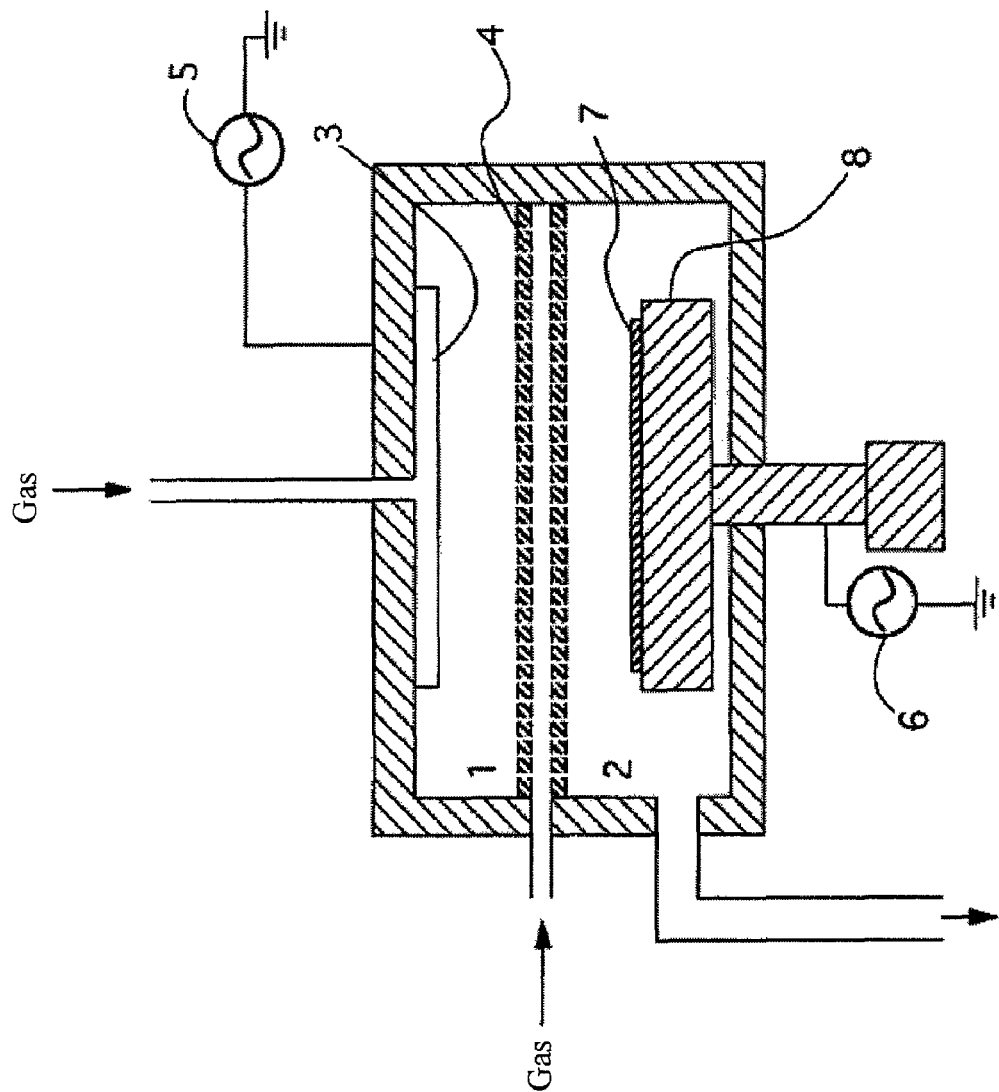
FIG. 1 is a schematic drawing of a two-chamber, separation-type gaseous-phase film formation apparatus used in the method of forming porous film according to an embodiment of the present invention.

The following explains in details embodiments of the present invention by referring to drawings. FIG. 1 is a schematic drawing of a two-chamber, separation-type gaseous-phase film growth/formation apparatus used in the method of forming thin film conforming to an embodiment of the present invention. This apparatus comprises two levels of processing chambers provided at top and bottom 1, 2, each having an exhaust means. An upper electrode 3 is installed on the ceiling of the upper processing chamber 1, and connected to an external gas supply apparatus (not illustrated). The bottom face of the upper electrode 3 has many pores, and gas is supplied into the upper processing chamber 1 through these pores. The upper electrode 3 also connects to an external radio-frequency oscillator 5 to serve as a radio-frequency electrode, as well.

Installed inside the lower processing chamber 2 is a susceptor 8 on which to place a semiconductor substrate 7 that becomes a processing target. The susceptor 8 has heating elements (not illustrated) embedded inside, and serves to heat the semiconductor substrate 7 to a specified temperature and maintains that temperature. The susceptor 8 connects to an external radio-frequency oscillator 6 to serve as a radio-frequency electrode, as well. The frequency ranges of these radio-frequency oscillators 5, 6 may be selected depending on the plasma properties desired in the respective processing chambers and may be the same or different. In an embodiment, the frequency ranges are between 1 MHz and 100 MHz.

An intermediate shower plate 4 is installed between the upper processing chamber 1 and lower processing chamber 2. The intermediate shower plate 4 is connected to an external material gas supply apparatus (not illustrated), and has many pores through which to supply material gas into the lower processing chamber 2. It also has many pores through which to introduce fine particles comprising organic compound, as formed in the upper processing chamber 1, into the reaction space inside the lower processing chamber 2. The intermediate shower plate 4 is electrically connected to ground. In an embodiment, the intermediate shower plate 4 comprises upper and lower compartments isolated from each other with respect to gas and allows gas in the upper processing chamber 1 to pass therethrough via first pores without gas-communicating with the interior of the intermediate shower plate 4 while introducing gas into the lower processing chamber 2 via second pores without gas-communicating with the upper processing chamber 1. This type of intermediate shower plate is disclosed in U.S. Patent Publication No. 2006/0021701, the disclosure of which is incorporated herein by reference in its entirety.

An exhaust port (not illustrated) is provided in the upper processing chamber 1 or lower processing chamber 2, or both, to exhaust air from the processing chamber(s), and each port is connected to an external vacuum pump (not illustrated). Each processing chamber is maintained at a specified pressure by means of a throttle valve (not illustrated).

Next, preferred embodiments of the method of forming porous film are explained.

The method conforming to an embodiment of the present invention includes a process of synthesizing fine particles comprising organic compound. First, the processing chambers 1, 2 are evacuated, and then gaseous organic compound gasified by an external evaporator is introduced into the upper processing chamber 1 through the upper electrode 3. As for organic compound, in an embodiment, the organic compound may contain at least one unsaturated bond and be constituted solely by C, H, and O, and at least one type of organic compound can be selected and used from a group consisting of: methane, ethane, propane, butane and other aliphatic hydrocarbons; ethylene, propene, butene, butadiene, acetylene, propylene, butyne and other hydrocarbons having carbon-carbon multi-bond; benzene, toluene, xylene, styrene, allylbenzene, divinylbenzene and other aromatic hydrocarbons; acrylate, methyl acrylate, ethyl acrylate, methyl methacrylate and ethyl methacrylate. As dilution gas, helium, argon or other inactive gas is added.

Next, radio-frequency power of 13.56 MHz or 60 MHz is applied to the upper electrode 3 by means of the radio-frequency oscillator 5, to generate plasma in the upper processing chamber 1. This activates organic compound to undergo polymerization reaction, and consequently synthesizes fine organic particles. Here, dilution gas of helium, argon, etc., is needed to generate plasma. Helium and argon have an ionization potential of 4.56 eV and 15.76 eV, respectively. Since helium has high heat conductivity, it is generally used to improve the uniformity of film thickness on the wafer surface. However, high-energy electrons are needed to generate plasma. In addition to helium and argon, dilution gas of xenon, krypton, etc., can be added by a small amount to control the reaction occurring in gaseous phase.

As another example, organic compound can be activated using ultraviolet light to cause polymerization reaction.

The reaction formulas explaining the production of respective polymers through applicable organic compound reactions are shown below.

M: Material monomer
M*+M*→M2* p(1): Dimer formation probability
M2*+M*→M3* p(2): Trimer formation probability
M3*+M*→M4* p(1): Tetramer formation probability As an example, reaction probability based on M*=$CH_3$ radical is shown in Table 1.

TABLE 1

| n-monomer Formation Probability | |
|---|---|
| p(1) | 25.6 |
| p(2) | 6.1 |
| p(3) | 1.4 |
| p(4) | 0.4 |
| p(5) | 0.1 |

If a condition where M* and M* have not yet collided with each other to cause reaction corresponds to 1, the probability of M2* being formed is indicated by p(1). Similarly when a condition where M2* and M* have not yet collided with each other to cause reaction corresponds to 1, the probability of M3* being formed is indicated by p(2). The larger the particles, the lower the reaction probability becomes.

Figure 2:
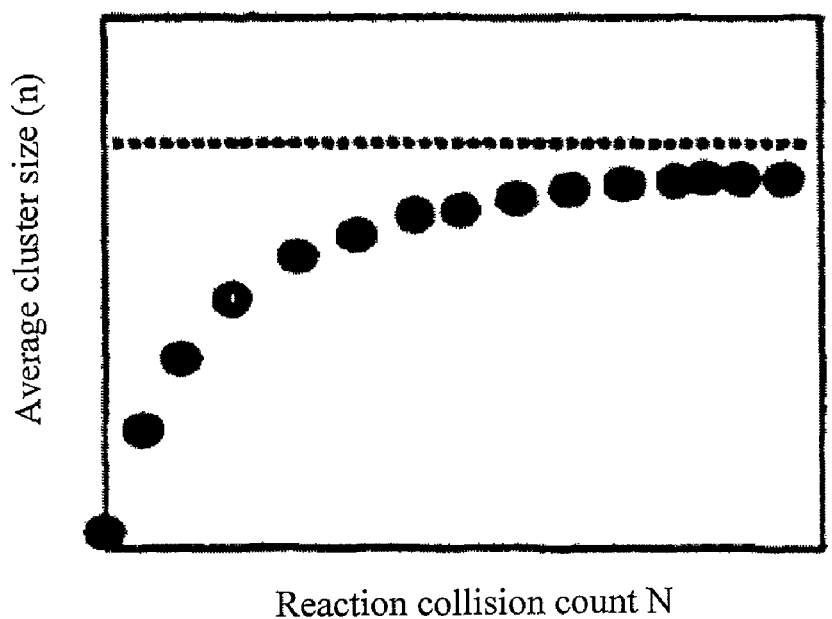
FIG. 2 is a graph showing the relationship of average cluster size and reaction collision count N.

In the above model, a cluster comprising N number of monomers may be formed after n number of collisions, in which case the cluster will not grow beyond N even if n increases. FIG. 2 is a graph showing the relationship of average cluster size and reaction collision count N. As shown in FIG. 2, the maximum cluster size is limited. Therefore, the cluster size can be controlled through proper selection of the type of organic compound to be used, as well as the reaction conditions. The reaction conditions include reaction chamber pressure, organic compound concentration in the reaction chamber, and radio-frequency power output.

In an embodiment, the average diameter of fine particles comprising organic compound (e.g., the average size of pores in the film) may be 10 nm or less, or preferably 5 nm or less, or more preferably 2 nm or less. However, in an embodiment, the average diameter of fine particles may be 1 nm or more (the average diameter of pores in a film formed without using the fine organic particles may be about 0.5 nm) Diameter of fine particles in gaseous phase can be measured using various methods such as laser scattering. A simpler method is to remove fine particles from film and then measure resulting pores using X-ray scattering (e.g., Hata et al., J. J. Appl. Phys 43(2004), 1323).

The method conforming to an embodiment of the present invention includes a process of reacting fine organic particles with silicon compound having Si—O bond and forming thin film containing fine particles on a semiconductor substrate. Fine particles comprising organic compound, as formed in the upper processing chamber 1, are introduced into the lower processing chamber 2 through the pores in the intermediate shower plate 4. When fine organic particles are introduced, plasma sheath may become an obstacle or plasma generated in the lower processing chamber 2 may break fine particles. In this case, plasma can be generated intermittently at periods of 1 Hz to 100 kHz, or preferably 1 Hz to 1 kHz, to solve these problems.

Silicon compound having Si—O bond, oxidizing agent, additives and carrier gas are introduced at a specified, controlled flow rate through the pores in the intermediate shower plate 4.

In an embodiment, a silicon compound having at least one Si—O bond in its molecule may be a cyclic siloxane compound expressed by [Si($R_1R_2$)—O]n (where $R_1$ and $R_2$ are $CH_3$, $C_2H_3$, $C_3H_7$ or $C_6H_5$, respectively, while n is an integer of 3 to 5). The compound is constituted solely by Si, C, H, and O and has multiple Si—O bonds in its molecule.

In another example, silicon compound having Si—O bond may be a compound expressed by the chemical formula (A) shown below.

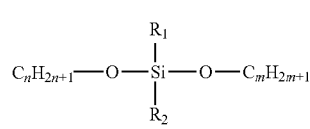

(A)

Here, $R_1$ and $R_2$ are $CH_3$, $C_2H_3$, $C_2H_5$, $C_3H_7$ or $C_6H_5$, respectively, while n and m are independently arbitrary integers of, e.g., 1-10.

In yet another example, silicon compound having Si—O bond may be a compound expressed by the chemical formula (B) shown below.

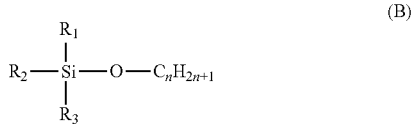

(B)

Here, $R_1$, $R_2$ and $R_3$ are $CH_3$, $C_2H_3$, $C_2H_5$, $C_3H_7$ or $C_6H_5$, respectively, while n is an arbitrary integer of e.g., 1-10.

In yet another example, silicon compound having Si—O bond may be a compound expressed by the chemical formula (C) shown below.

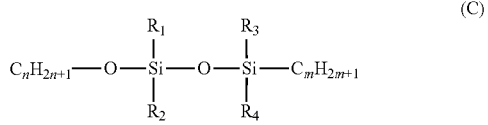

(C)

Here, $R_1$, $R_2$, $R_3$ and $R_4$ are $CH_3$, $C_2H_3$, $C_2H_5$, $C_3H_7$ or $C_6H_5$, respectively, while n and m are independently arbitrary integers of e.g., 1-10.

In addition to the above, tetraethoxysilane (TEOS) or tetramethoxysilane (TMOS) may be used as silicon compound having Si—O bond.

$O_2$, $N_2O$ or $H_2O$ is used as an oxidizing agent. Examples of additive include $CH_3OH$, $C_2H_5OH$, $C_3H_7OH$ and other alcohols. By using an oxidizing agent, excess hydrocarbons in Si compound can be removed. Supplying $H_2O$ causes hydrolysis, which provides an easy way to constitute a Si—O—Si network. As dilution gas, helium, argon or other inactive gas is used.

In the lower processing chamber 2, radio-frequency power of 13.56 MHz or 60 MHz, for example, is applied to the susceptor 8 by means of the radio-frequency oscillator 6, to generate plasma therein and cause chemical reaction in the reaction space inside the lower processing chamber 2. Plasma activates the mixed gas, and film containing fine particles comprising organic compound and having Si—O bond as the skeletal component is formed on the semiconductor substrate 7.

In an embodiment, while film is being formed, the susceptor 8 may be maintained at temperatures of 300° C. or below, or preferably 150° C. or below. The semiconductor substrate 7 is retained on the susceptor 8 and heated. The number of fine organic particles contained in film can be increased by keeping the susceptor or semiconductor substrate 7 at lower temperatures.

The method conforming to an embodiment of the present invention further includes a process of removing fine organic particles from formed film. After film has been formed, the processing chambers 1, 2 are evacuated and then inactive gas of Ar or He and/or $H_2$ is introduced into the processing chamber 2 through the pores in the intermediate shower plate 4. Thereafter, radio-frequency power is applied by means of the radio-frequency oscillator 6 to generate plasma. Plasma energy removes fine organic particles and pores are formed in film as a result.

In another example, the semiconductor substrate 7 may be annealed to remove fine organic particles. Annealing is performed for 1 hour at 400° C. Since presence of oxidizing gas such as $O_2$ during the annealing process causes film to shrink, annealing is performed in $N_2$ atmosphere and the oxygen level is suppressed to 10 ppm or below. It is also possible to add a trace amount of tetramethyl cyclotetrasiloxane (TM-CTS, $[SiH(CH_3)—O]_4$) during annealing to cause hydrophobization.

In yet another example, the semiconductor substrate 7 may be irradiated with ultraviolet (UV) irradiation to remove fine organic particles.

The conditions of formation and curing of a film disclosed in U.S. patent application Ser. No. 11/175,511 owned by the same assignee can be used in an embodiment, the disclosure of which is incorporated herein by reference in its entirety.

In the preferred embodiments mentioned above, a processing apparatus having two separate chambers at top and bottom was used. In addition to this apparatus, a parallel-plate plasma processing apparatus can also be used. Plasma processing is carried out using helium, argon or other inactive gas, or hydrogen, or mixture gas of any combination thereof.

Example

The following explains the film formation test conducted using the method conforming to the present invention. Methyl methacrylate (MMA, $CH_2\!=\!C(CH_3)COOCH_3$) was used as organic compound, and trivinyl trimethyl siloxane (3M3VTS, $[Si(CHCH_2)(CH_3)—O]_3$) was used as silicon compound having Si—O bond. In the test, a plasma CVD apparatus (EAGLE®-6) manufactured by ASM Japan K.K. was used. The film forming conditions and measured film characteristics are shown in Table 2.

TABLE 2

| | Conditions in upper processing chamber | | | Conditions in lower processing chamber | | | |
|---|---|---|---|---|---|---|---|
| Example | MMA sccm | He sccm | RF (60 MHz) W | 3M3VTS sccm | He sccm | RF (13.56 MHz) W | k value |
| 1 | 180 | 300 | 100 | 7 | 200 | 200 | 2.55 |
| 2 | 90 | 300 | 100 | 7 | 200 | 200 | 2.63 |
| 3 | 180 | 300 | — | 7 | 200 | 200 | 2.63 |

Figure 3:
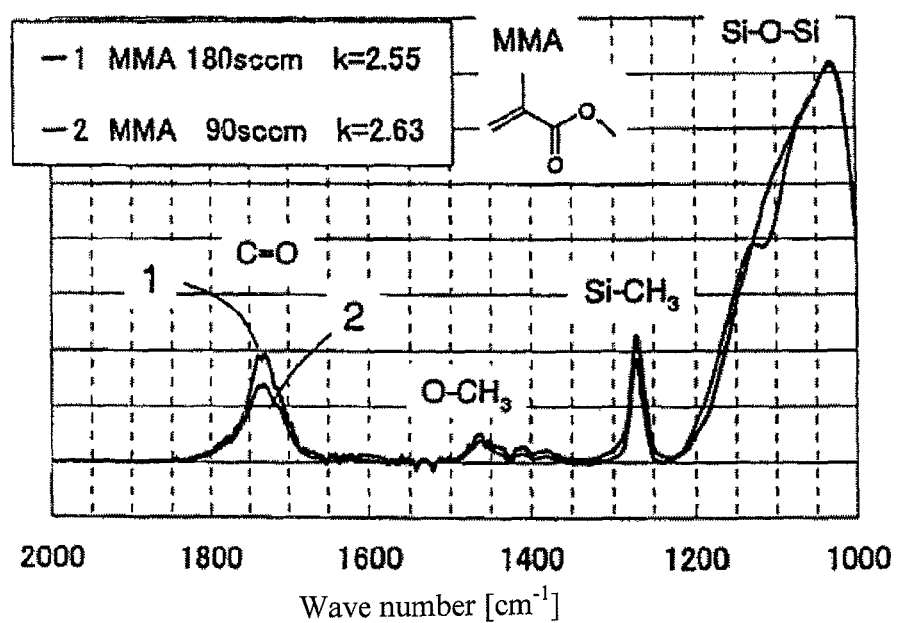
FIG. 3 is a FTIR graph of film samples produced in Examples 1 and 2 used in the test.

In Examples 1 and 2, film was produced by means of forming polymer in the upper processing chamber 1 and then introducing it into the lower processing chamber 2. On the other hand, in Example 3 film was produced by carrying out the entire reaction in the lower processing chamber 2 alone. FIG. 3 is a FTIR graph of film samples produced in examples 1 and 2 before annealing. The annealing was performed in a $N_2$ atmosphere at 425° C. for one hour.

From the results shown in Table 2, particularly from comparison of Examples 1 and 2, the film obtained in Example 1 where more MMA was supplied to the upper processing chamber 1 had a lower specific dielectric constant. This is probably because the amount of organic nanocluster produced is proportional to the amount of organic compound supplied. As shown in FIG. 3, Example 1 resulted in higher C=O peaks near 1,700 cm$^{-1}$, which can be explained by more pores formed in the film as it must have increased the porosity and consequently lowered the dielectric constant.

Also, comparison of Examples 1 and 3 based on the results shown in Table 2 finds that although the amount of MMA was the same, film produced in Example 1, which involved the process of supplying polymer produced in the upper processing chamber 1 to the lower processing chamber 2, had a lower specific dielectric constant. This is probably due to the fact that causing the entire reaction in the lower processing chamber alone makes it difficult to form organic compound polymer.

The present invention includes the above mentioned embodiments and other various embodiments including the following:

1) A method of forming porous film on a processing target, comprising: a process of synthesizing fine particles comprising organic compound through polymerization of organic compound in gaseous phase; a process of reacting the fine particles with silicon compound having Si—O bond, and forming film containing the fine particles on the processing target; and a process of removing the fine particles from the film.

2) A method according to Item 1, wherein the process of synthesizing fine particles comprises a process of causing polymerization reaction of organic compound using plasma.

3) A method according to Item 1, wherein the process of synthesizing fine organic particles comprises a process of causing polymerization reaction of organic compound using ultraviolet light.

4) A method according to any one of Items 1 through 3, wherein the organic compound contains at least one unsaturated bond.

5) A method according to Item 1, wherein the process of forming film is carried out using plasma.

6) A method according to Item 1, wherein the process of synthesizing fine particles and the process of forming film are carried out in separate processing chambers.

The present application claims priority to Japanese Patent Application No. 2005-330368, filed Nov. 15, 2005, the disclosure of which is incorporated herein by reference in its entirety.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of forming a porous film on a processing target, comprising the steps of:
forming fine organic particles by polymerizing a non-silicon organic compound in a gaseous phase by a plasma using a gas consisting essentially of the organic compound and an inert gas, thereby inhibiting growing oversized organic particles and controlling the average size of the fine organic particles to 10 nm or less;
mixing the fine organic particles with a silicon compound containing a Si—O bond in a gaseous phase, thereby depositing a film containing the fine particles on the processing target; and
removing the fine organic particles from the film,
wherein the step of forming the fine organic particles and the step of depositing the film are performed in separate processing chambers,
wherein the separate processing chambers are upper and lower chambers connected via an intermediate shower plate which is electrically grounded, and
wherein the organic compound is supplied to the upper chamber at a flow rate which is more than 10 times that of the silicon compound supplied to the lower chamber.

2. The method according to claim 1, wherein the organic compound contains at least one unsaturated bond.

3. The method according to claim 1, wherein the step of depositing the film is performed using a plasma.

4. The method according to claim 3, wherein the plasma in the lower chamber is generated intermittently at periods of 1 Hz to 100 kHz.

5. The method according to claim 1, wherein the organic compound is constituted solely by C, H, and O.

6. The method according to claim 1, wherein the silicon compound is constituted solely by Si, C, H, and O.

7. The method according to claim 6, wherein the silicon compound has multiple Si—O bonds in a molecule.

8. The method according to claim 1, wherein first RF power is applied in the upper chamber for forming the fine organic particles, and second RF power is applied in the lower chamber for depositing the film, wherein the first RF power and the second RF power have different frequencies.

9. The method according to claim 1, wherein in the step of forming the fine organic particles, the inert gas is supplied as a first inactive gas to the upper chamber, and the step of depositing the film further comprises supplying a second inactive gas to the lower chamber, said first and second inactive gases being supplied separately.

10. The method according to claim 9, wherein the first inactive gas is supplied to the upper chamber at a flow rate higher than that of the organic compound, and the second inactive gas is supplied to the lower chamber at a flow rate higher than that of the silicon compound.

11. The method according to claim 1, wherein the film obtained from the step of removing the fine organic particles has a dielectric constant of 2.65 or less.

12. The method according to claim 11, wherein the dielectric constant of the film is adjusted as a function of a flow of the organic compound in the step of forming the fine organic particles.

13. The method according to claim 1, wherein the step of removing the fine organic particles comprises placing the target in a chamber and annealing the film.

* * * * *

UNITED STATES PATENT AND TRADEMARK OFFICE
CERTIFICATE OF CORRECTION

PATENT NO.         : 8,105,661 B2
APPLICATION NO.    : 11/559797
DATED              : January 31, 2012
INVENTOR(S)        : Hyodo et al.

It is certified that error appears in the above-identified patent and that said Letters Patent is hereby corrected as shown below:

On the Title page,

Item (73), lines 2-3, please change "Chihasaki-shi, Kanagawa, (JP)" with

-- Chigasaki-shi, Kanagawa, (JP) --

Signed and Sealed this
Nineteenth Day of June, 2012

David J. Kappos
*Director of the United States Patent and Trademark Office*